United States Patent
Bruce et al.

(10) Patent No.: US 9,536,731 B2
(45) Date of Patent: Jan. 3, 2017

(54) WET CLEAN PROCESS FOR REMOVING $C_xH_yF_z$ ETCH RESIDUE

(71) Applicants: INTERNATIONAL BUSINESS MACHINES CORPORATION, Armonk, NY (US); Zeon Corporation, Tokyo (JP)

(72) Inventors: Robert L. Bruce, White Plains, NY (US); Sebastian U. Engelmann, New York, NY (US); Eric A. Joseph, White Plains, NY (US); Mahmoud Khojasteh, Poughkeepsie, NY (US); Masahiro Nakamura, Eastchester, NY (US); Satyavolu S. Papa Rao, Poughkeepsie, NY (US); Bang N. To, Yorktown Heights, NY (US); George G. Totir, Newtown, CT (US); Yu Zhu, West Harrison, NY (US)

(73) Assignees: INTERNATIONAL BUSINESS MACHINES CORPORATION, Armonk, NY (US); ZEON CORPORATION, Tokyo (JP)

( * ) Notice: Subject to any disclaimer, the term of this patent is extended or adjusted under 35 U.S.C. 154(b) by 4 days.

(21) Appl. No.: 14/523,515

(22) Filed: Oct. 24, 2014

(65) Prior Publication Data
US 2015/0118839 A1    Apr. 30, 2015

Related U.S. Application Data

(60) Provisional application No. 61/895,444, filed on Oct. 25, 2013.

(51) Int. Cl.
*H01L 21/302*  (2006.01)
*H01L 21/02*  (2006.01)
(Continued)

(52) U.S. Cl.
CPC .......... *H01L 21/0206* (2013.01); *C11D 7/105* (2013.01); *C11D 11/0047* (2013.01); *H01L 21/28008* (2013.01); *H01L 21/31116* (2013.01)

(58) Field of Classification Search
CPC .. C11D 11/0047; C11D 7/105; H01L 21/0206; H01L 21/28008; H01L 21/31116
(Continued)

(56) References Cited

U.S. PATENT DOCUMENTS

| | | | |
|---|---|---|---|
| 8,367,556 B1 * | 2/2013 | Fuller | H01L 21/82343 257/E21.005 |
| 2002/0111039 A1 * | 8/2002 | Moore | C23C 16/308 438/778 |

(Continued)

OTHER PUBLICATIONS

Engelmann, S. et al., "Dependence of photoresist surface modifications during plasma-based pattern transfer on choice of feedgas composition: Comparison of C4F8- and CF4-based discharges," Journal of Vacuum Science & Technology B. May/Jun. 2009 vol. 27, No. 3. (pp. 1165-1179).

Guillorn, M. et al., "Hydrogen silsesquioxane-based hybrid electron beam and optical lithography for high density circuit prototyping," Journal of Vacuum Science & Technology B. Nov./Dec. 2009 vol. 27 No. 6. (pp. 2588-2592).

(Continued)

*Primary Examiner* — H Tsai
(74) *Attorney, Agent, or Firm* — Tutunjian & Bitetto, P.C.; Louis J. Percello

(57) ABSTRACT

A method for cleaning etch residues that may include treating an etched surface with an aqueous lanthanoid solution, wherein the aqueous lanthanoid solution removes an etch residue that includes a majority of hydrocarbons and at least one element selected from the group consisting of carbon, oxygen, fluorine, nitrogen and silicon. In one example, the aqueous solution may be cerium ammonium nitrate $(Ce(NH_4)(NO_3))$,(CAN).

15 Claims, 3 Drawing Sheets

(51) Int. Cl.
    *H01L 21/28*     (2006.01)
    *H01L 21/311*     (2006.01)
    *C11D 11/00*     (2006.01)
    *C11D 7/10*     (2006.01)

(58) Field of Classification Search
    USPC .................................. 438/299–307, 745–757
    See application file for complete search history.

(56) References Cited

U.S. PATENT DOCUMENTS

2005/0209117 A1*   9/2005   Friedrich ........... C08G 73/0233
                                                      510/175
2013/0123159 A1*   5/2013   Afzali-Ardakani .... C09K 13/04
                                                      510/176

OTHER PUBLICATIONS

Kyu Ahn, M. et al., "Etch Challenges for 1x nm NAND Flash," SPIE 8328, Advanced Etch Technology for Nanopatterning, vol. 8328, Mar. 17, 2012. (8 Pages).
Schaepkens, M. et al., "Study of the SiO2-to-Si3N4 etch selectivity mechanism in inductively coupled fluorocarbon plasmas and a comparison with the SiO2-to-Si mechanism," Journal of Vacuum Science & Technology A. Jan./Feb. 1999. vol. 17 No. 1. (pp. 26-37).
Wakamatsu, G., et al., "Investigation of pattern wiggling for spin-on organic hardmask materials," SPIE 8325, Advances in Resist Materials and Processing Technology XXIX, Mar. 20, 2012. vol. 8325. (9 Pages).

\* cited by examiner

US 9,536,731 B2

WET CLEAN PROCESS FOR REMOVING $C_xH_yF_z$ ETCH RESIDUE

RELATED APPLICATION INFORMATION

This application claims priority to provisional application Ser. No. 61/895,444 filed on Oct. 25, 2013, incorporated herein by reference.

BACKGROUND

Technical Field

The present disclosure relates generally to microelectronic fabrication, and more particularly to methods of removing etch residues that can be formed during microelectronic fabrication.

Description of the Related Art

With the continuing trend towards miniaturization of integrated circuits (ICs), there is a need for transistors to have higher drive currents with increasingly smaller dimensions. Part of processing advancements to provide smaller dimensions in microelectronic devices includes advancements in etch processing. The spacer module can be considered most challenging, as all materials exposed to plasma etch remain on device. The spacer module refers to the formation of the gate sidewall spacer adjacent to the gate structure of a semiconductors devices, such as field effect transistors (FETs). Processing at the spacer module becomes even more challenging for novel device geometries, such as Fin FETs, trigate semiconductor devices, and nanowire semiconductor devices.

SUMMARY

In one embodiment, a method for cleaning etch residues is provided that includes treating an etched surface with an aqueous lanthanoid solution, wherein the aqueous lanthanoid solution removes an etch residue comprising a majority of hydrocarbons at and least one element selected from the group consisting of carbon, oxygen, fluorine, nitrogen and silicon.

In another aspect, a method of forming a semiconductor device is provided that includes forming a gate structure on a channel region of a semiconductor substrate. The gate structure is formed using an etch process the forms an etch residue on at least a sidewall of a gate spacer to the gate structure and an upper surface of the semiconductor substrate adjacent to the gate structure. A majority of the etch residue composition is comprised of hydrocarbons. The etch residue may be removed with an aqueous lanthanoid solution comprising a majority of hydrocarbons and least one element selected from the group consisting of carbon, oxygen, fluorine, nitrogen and silicon.

In another embodiment, an etch chemistry is provided that includes an aqueous solution for removing etch residues comprising a majority of hydrocarbons. The aqueous solution includes a member of the lanthanide family. In some embodiments, the aqueous solution may further include at least one nitrogen including compound, such as ammonia ($NH_4$) and nitrate ($NO_3$). In one example, the aqueous solution may be cerium ammonium nitrate ($Ce(NH_4)_2(NO_3)_6$), (CAN).

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
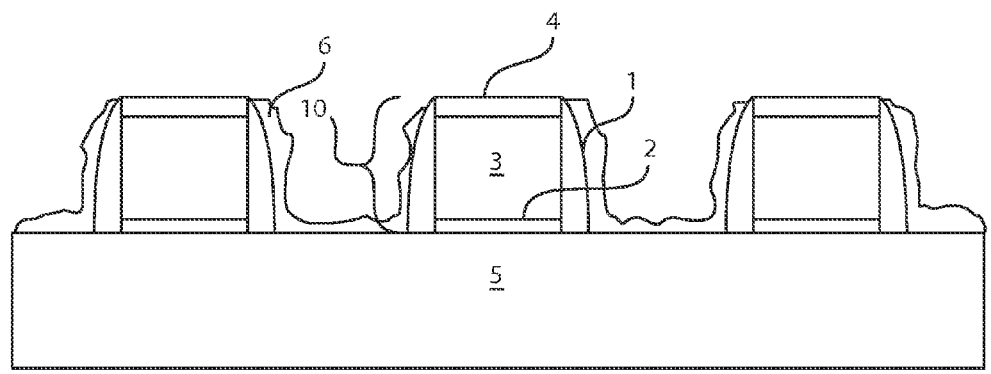
FIG. 1 is a side cross-sectional view of a method of forming a semiconductor device that includes forming a gate structure on a channel region of a semiconductor substrate using an etch process the forms a high concentration hydrocarbon etch residue on at least a sidewall of a gate spacer to the gate structure and an upper surface of the semiconductor substrate adjacent to the gate structure, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide a selective wet chemistry for the removal of post reactive ion etch (RIE) residues. As will be described in further detail below, the residue composition produced by $C_4H_9F$ etch chemistries may be composed mostly of C, H & Si compounds. Raman Spectroscopy also confirmed that the $C_xH_yF_z/O_2$ etch generated monomer or polymeric species with graphitic functionalities. Prior methods for removing etch residues typically employ a strip chemistry composed of ammonia ($NH_3$). It has also been determined that $NH_3$ plasma strip processing that is typically performed to remove etch residues damages the silicon (Si) surface of the wafer, i.e., semiconductor substrate, which results in silicon loss.

The methods and structures disclosed herein provide a wet chemistry to remove post $C_xH_yF_z/O_2$ plasma etch residues with a wet chemistry that provides maximum surface integrity protection. An innovative chemistry/process has been disclosed herein that removes post $C_xH_yF_z/O_2$ plasma etch residues including modified graphite with a wet oxidation chemistry, such as an aqueous lanthanoid solution, and final clean using warm sulfuric acid solution ($H_2SO_4$). The etch and cleaning process that is disclosed herein may be applied in the processing of semiconductor devices. As used herein, "semiconductor device" refers to an intrinsic semiconductor material that has been doped, that is, into which a doping agent has been introduced, giving it different electrical properties than the intrinsic semiconductor. In some embodiments, the semiconductor devices are field effect transistors (FETs). A field effect transistor (FET) is a transistor in which output current, i.e., source-drain current, is controlled by the voltage applied to the gate. A field effect transistor typically has three terminals, i.e., gate, source and drain. The semiconductor devices that the etch and clean processes of the present disclosure are applied to may be planar semiconductor devices, FinFETS, Trigate semiconductor devices, nanowire semiconductor devices. The semiconductor devices disclosed herein may also be provided by memory devices, e.g., flash memory or eDRAM memory. Further details of the methods and structures of the present disclosure are now discussed with greater detail with reference to FIGS. 1-6.

In some embodiments, a method of forming a semiconductor device is provided that includes forming a gate structure 10 on a channel region of a semiconductor substrate 5, the gate structure 10 formed using an etch process the forms an etch residue 6 on at least a sidewall of a gate sidewall spacer 1 to the gate structure 10 and an upper surface of the semiconductor substrate 5 adjacent to the gate structure. In some embodiments, a majority of the etch residue 6 composition is composed of hydrocarbons. In some embodiments, the methods disclosure herein remove the high concentration hydrocarbon etch residue 6 with an aqueous lanthanoid solution 7.

FIG. 1 depicts forming a gate structure 10 on a channel region of a semiconductor substrate 5, wherein at least one component of the gate structure 10 is etched with a $C_4H_9F$ etch chemistry that produces etch residues 6 on the surface of the dielectric gate sidewall spacers 1 and the exposed upper surface of the semiconductor substrate 5. The etch residues 6 are mostly composed of C, H & Si compounds.

In some embodiments, forming the gate structure 10 may include depositing at least one gate dielectric layer 2 on the semiconductor substrate 5 and at least one gate conductor layer 3 on the gate dielectric layer 2 to provide a gate stack, and patterning the gate stack to provide a remaining portion of a gate stack on the channel region of the semiconductor substrate 5.

The semiconductor substrate 5 may be a bulk-semiconductor substrate. In one example, the bulk-semiconductor substrate may be a silicon-containing material. Illustrative examples of Si-containing materials suitable for the bulk-semiconductor substrate include, but are not limited to, Si, SiGe, SiGeC, SiC, polysilicon, i.e., polySi, epitaxial silicon, i.e., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide. Although not depicted in FIG. 1, the semiconductor substrate 5 may also be a semiconductor on insulator (SOI) substrate or an extremely thin semiconductor on insulator (ETSOI) substrate.

The gate structure 10 may be formed on the channel region of the semiconductor substrate 5 for each semiconductor device that is formed on the semiconductor substrate 5. The term "gate structure" denotes a structure used to control output current (i.e., flow of carriers in the channel) of a semiconducting device through electrical fields. As used herein, the term "channel region" is the region underlying the gate structure and between the source and drain of a semiconductor device that becomes conductive when the semiconductor device is turned on. The gate structure 10 may include at least one gate dielectric layer 2, at least one gate conductor layer 3, at least one gate dielectric cap 4, and at least one gate sidewall spacer 1.

The at least one gate dielectric layer 2 may be a dielectric material, such as $SiO_2$, or alternatively high-k dielectrics, such as oxides of Ta, Zr, Al or combinations thereof. In another embodiment, the at least one gate dielectric layer 2 is comprised of an oxide, such as $SiO_2$, $ZrO_2$, $Ta_2O_5$ or $Al_2O_3$. In one embodiment, the gate dielectric layer 2 has a thickness ranging from 1 nm to 10 nm. In some examples, when the at least one gate dielectric layer 2 is composed of a high-k dielectric, the gate dielectric layer 2 may be composed of hafnium oxide ($HfO_2$).

The at least one gate conductor layer 3 may include a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In other embodiments, the at least one gate conductor 3 may include a doped semiconductor material, such as a doped silicon containing material, e.g., doped polysilicon. When a combination of conductive elements is employed in the at least one gate conductor layer 3, an optional diffusion barrier material such as TaN or WN may be formed between the conductive materials.

In some embodiments, a gate dielectric cap 4 may be present atop the at least one gate conductor 3. The at least one gate dielectric cap 4 may be composed of an oxide or nitride material.

Each of the material layers for the gate dielectric cap 4, the at least one gate conductor layer 3, and the gate dielectric layer 2 may be formed using a deposition or growth process. For example, the gate dielectric layer 2 and the gate dielectric cap 4 may be formed using a chemical vapor deposition (CVD) process, such as plasma enhanced CVD (PECVD). The gate conductor layer 3 may be formed using a physical vapor deposition (PVD) process, e.g., sputtering, when the gate conductor layer 3 is composed of a metal, or the gate conductor layer 3 may be formed using a chemical vapor deposition (CVD) process when the gate conductor layer 3 is composed of a doped semiconductor material, e.g., polysilicon.

Following formation of the gate stack, the stack of material layers are patterned and etched. Specifically, a pattern is produced by applying a photoresist to the surface of the gate stack to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The etch process for removing the exposed portions of the gate stack may be an anisotropic etch. As used herein, an "anisotropic etch process" denotes a material removal process in which the etch rate in the direction normal to the surface to be etched is greater than in the direction parallel to the surface to be etched.

The anisotropic etch process may be provided by reactive ion etch. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. In some embodiments, the etch process for etching the gate stack includes a $C_xH_yF_z$ etch chemistry. For example, the $C_xH_yF_z$ etch chemistry may be $C_4H_9F$. In some embodiments, the $C_xH_yF_z$ etch chemistry may be a $C_xH_yF_z/O_2$ plasma etch process.

A gate sidewall spacer 1 can be formed in direct contact with the sidewalls of the gate stack. The gate sidewall spacers 1 are typically narrow having a width ranging from 2.0 nm to 15.0 nm. The gate sidewall spacer 1 can be formed using deposition and etch processing steps. For example, the gate sidewall spacer 1 may be formed by forming a conformal dielectric layer on the remaining portion of the gate stack, and etching the conformal dielectric layer to provide the gate sidewall spacer 1. The term "conformal" denotes a layer having a thickness that does not deviate from greater than or less than 30% of an average value for the thickness of the layer. The gate sidewall spacer 1 may be composed of a dielectric, such as nitride, oxide, oxynitride, or a combination thereof. In one example, the gate sidewall spacer 1 is composed of silicon nitride. The conformal dielectric layer may be deposited using a chemical vapor deposition (CVD) process, such as plasma enhanced chemical vapor deposition (PECVD). The etch process for forming the gate sidewall spacer 1 may be an anisotropic etch. The anisotropic etch process may be provided by reactive ion etch (RIE). In some embodiments, the etch process for forming the gate sidewall spacer 1 includes a $C_xH_yF_z$ etch chemistry. For example, the $C_xH_yF_z$ etch chemistry may be $C_4H_9F$ or $C_4H_8F_2$. In some embodiments, the $C_xH_yF_z$ etch chemistry may be a $C_xH_yF_z/O_2$ plasma etch process. The etch process may include plasma RF etch processing in which the power may range from 100 volts to 200 volts. In some examples, the etch gas may be introduced to the etch surface at a flow rate ranging from 100 cfm to 200 cfm.

The $C_xH_yF_z$ etch chemistry that can be used to form the gate sidewalls spacer 1 typically forms a high concentration hydrocarbon etch residue 6 on at least a sidewall of a gate sidewall spacer 1 to the gate structure 10, and an upper surface of the semiconductor substrate 5 adjacent to the gate structure 10. The $C_4H_9F$ etch chemistry forms an etch residue comprising a hydrocarbon composition including a semi graphitic structure, which includes hydrogen carbon double bonds. The hydrocarbon composition of the etch residue is not entirely graphitic, since the etch residue is not entirely composed of hydrogen carbon double bonds. As used herein, the term "high hydrocarbon concentration residue" denotes a solid material having a composition that is greater than 50 wt. % hydrocarbons. In some embodiments, the etch residue 6 may comprise hydrocarbons in an amount greater than 80 wt. %. In other embodiments, the etch reside may comprise hydrocarbons in an amount ranging from 90 wt. % to 95 wt. %. In different embodiments, the concentration of hydrocarbons in the high hydrocarbon concentration residue 6 that is produced by the $C_xH_yF_z$ etch chemistry may be, for example, 50, 55, 60, 65, 70, 75, 80, 85, 90, 95 and 99 wt. %, or within a range established by any two of these values.

The etch residue 6 may be present on at least one of the sidewalls of the gate sidewall spacer 1 and the exposed upper surface of the semiconductor substrate 5 that is present between adjacent gate structures 10. Although the etch residue 6 is depicted on the sidewalls of the gate sidewall spacers 1, embodiments have been contemplated, in which the etch residue is formed prior to the formation of the gate sidewall spacers 1, wherein the etch residue 6 is formed on the sidewalls of the gate stack. The wet cleaning process including the aqueous lanthanoid solution that is disclosed herein may be employed for removing etch residues produced while forming the gate stack, as well as the etch residues that are formed on the gate sidewall spacers 1 and the upper surface of the semiconductor substrate 5.

Figure 2:
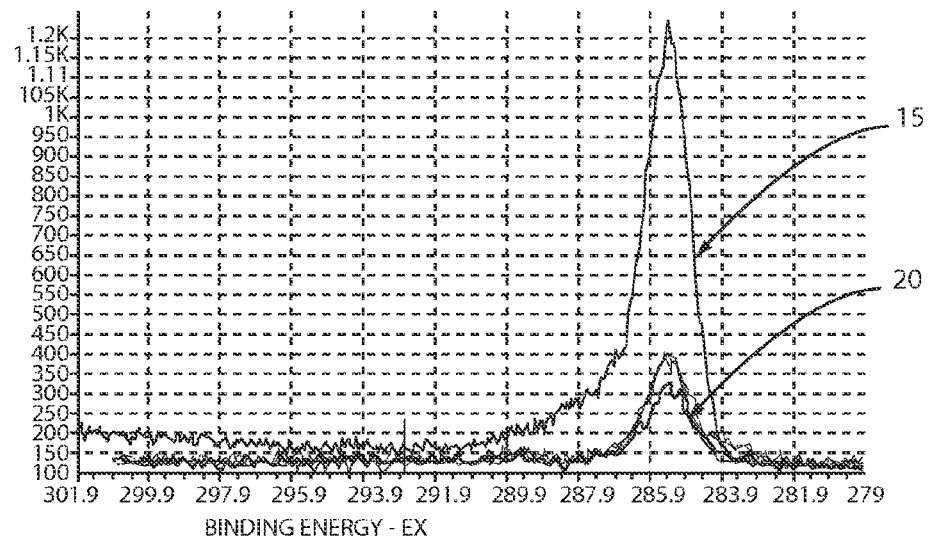
FIG. 2 is a plot of X-ray photoelectron spectroscopy data depicting stripping effectiveness of etch residue formed by an $C_xH_yF_z/O_2$ etch process.

It has been determined that the etch residue produced by the $C_xH_yF_z/O_2$ plasma etch process can be difficult to remove. FIG. 2 is a plot of X-ray photoelectron spectroscopy data depicting stripping effectiveness of etch residue formed by an $C_4H_9F/O_2$ etch process. Plot line 15 illustrates the presence of a high hydrocarbon concentration residue that is formed following a $C_4H_9F/O_2$ plasma etch process. This is the control data. Plot line 20 illustrates the results of applying a clean process to the high hydrocarbon concentration residue that is produced by the $C_4H_9F/O_2$ plasma etch process. Plot line 20 illustrates the data produced by a number of wet clean compositions including $NH_3$ or $O_2$ based clean chemistries. The reduced peak of the plot line for the data produced by the clean processes identified by reference number 20, in comparison to the plot line for the control data identified by reference number 15, illustrate that the typical $NH_3$ and $O_2$ based dry clean chemistries are ineffective for removing the entirety of the high hydrocarbon concentration residue 6 that is formed by the $C_4H_9F/O_2$ plasma etch process.

The etch residue 6 produced by the $C_4H_9F/O_2$ plasma etch process can be characterized as being polymeric, and including a graphite like component. The etch residue 6 includes elements from the etch chemistry and the materials being etched. For example, hydrogen (H), fluorine (F) and carbon (C) can be introduced into the etch residue 6 from the composition of the etchant, i.e., $C_4H_9F/O_2$ plasma. For example, silicon (Si), oxygen (O) and nitrogen (N) may be introduced into the etch residue 6 for the material being etched. In one embodiment, the carbon (C) content within the etch residue 6 may range from 20 at. % to 80 at. %; the oxygen (O) content within the etch residue 6 may range from 10 at. % to 45 at. %; the fluorine (F) content within the etch residue 6 is less than 15 at. %; the silicon (Si) content in the etch residue 6 may range from 30 at. % to 60 at. %; and the nitrogen (N) content in the etch residue 6 may be 15 at. % or less.

In some embodiments, the etch residue 6 may further include an adduct, in which the adduct includes one or more particles that have been sputtered into the etch residue 6 as a part of the reactive ion etch (RIE) process. In some embodiments, the adduct may be composed of a nitride, such as silicon nitride. Other adducts that may be introduced to the etch residue may be oxides. Additional elements that can be incorporated into the etch residue may include aluminum (Al), sulfur (S), sodium (Na), magnesium (Mg) or a combination thereof.

Figure 3:
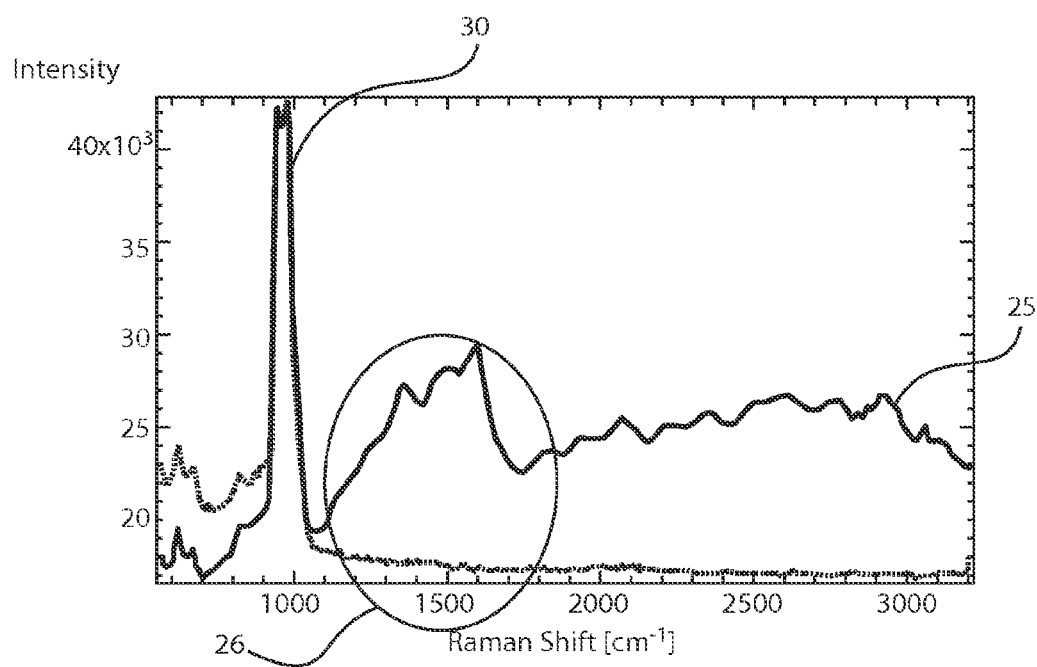
FIG. 3 is a plot of Raman spectra illustrating the composition of etch residue formed by an $C_xH_yF_z/O_2$ etch and $NH_3$ clean process.

As indicated above, the carbon (C) component of the etch residue 2D may be semi-graphitic in nature. By "graphitic" it is meant that the carbon has a layered, planar structure, wherein in each layer of the graphite the carbon atoms are arranged in substantially a honeycomb lattice. FIG. 3 is a plot of Raman spectra illustrating the composition of etch residue formed by at least one of $C_xH_yF_z/O_2$ etch and $NH_3$ clean process. The plot line identified by reference number 25 is the Raman spectra measured from etch residues formed from a $C_xH_yF/O_2$ plasma etch, wherein the introduction of the $O_2$ to the $C_4H_9F$ plasma etch produces an etch residue 6 that is a monomeric or an oligomeric species with graphitic functionalities. The graphitic functionality within the etch residue is identified by reference number 26 in plot line 25 of FIG. 3. The graphitic surface layer can be used to provide facilitate etch selectivity for the $C_xH_yF_z/O_2$ etch process. The plot line identified by reference number 30 is a plot of residues following an $C_xH_yF_z/O_2$ etch and $NH_3$ clean process. It is noted, that the $NH_3$ process can remove the graphitic portion of the etch residue, but the $NH_3$ process also impacts the structure of a gate conductor composed of metal, which may be referred to as a metal gate structure. The $NH_3$ process can etch, i.e., remove material from, a metal gate conductor. The aqueous lanthanoid solution that is described herein can remove high hydrocarbon concentration etch residues without negatively impacting the physical properties of a metal gate conductor, i.e., a metal gate structure. For example, an aqueous lanthanoid solution of cerium ammonium nitrate $Ce(NH_4)_2(NO_3)_6$, (CAN) will not attack a metal gate structure. For example, an aqueous lanthanoid solution of cerium ammonium nitrate $Ce(NH_4)_2(NO_3)_6$, (CAN) will not exceed 5% etching of the metal gate structure.

Figure 4:
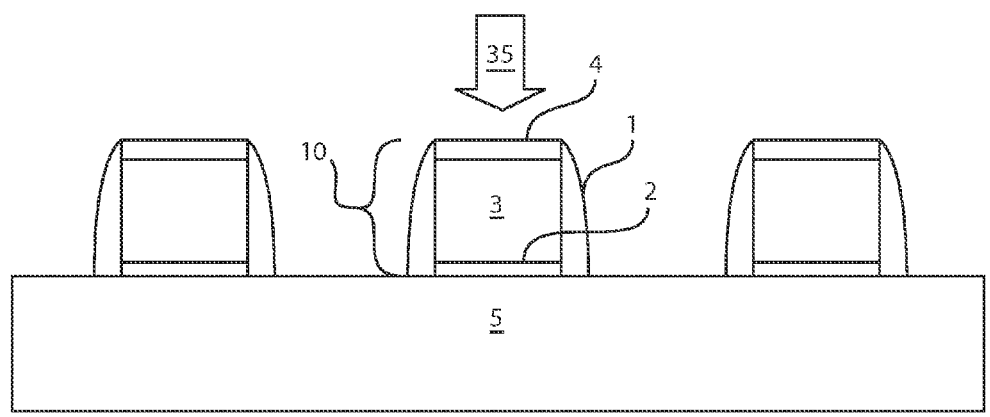
FIG. 4 is a side cross-sectional view depicting removing the high concentration hydrocarbon etch residue with an aqueous lanthanoid solution, in accordance with one embodiment of the present disclosure.
Figure 5:
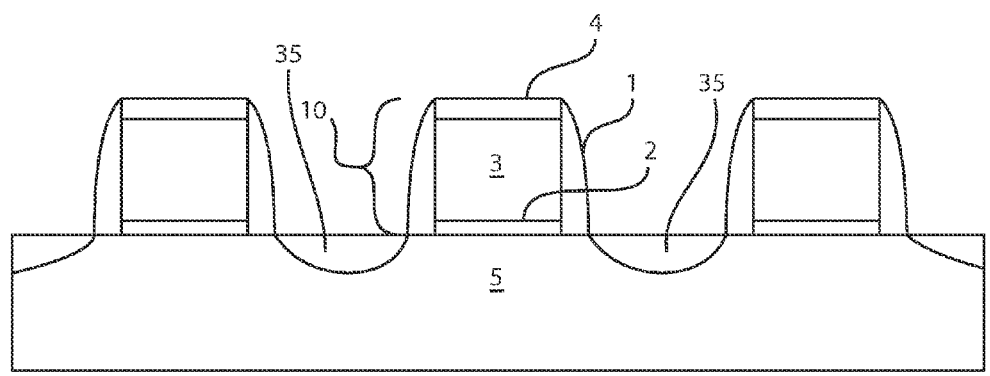
FIG. 5 is a side cross-sectional view depicting forming a source region and a drain region on opposing sides of the gate structure, in accordance with one embodiment of the present disclosure.

FIG. 4 depicts removing the high concentration hydrocarbon etch residue 6 with an aqueous lanthanoid solution 35. First, the aqueous lanthanoid solution, which typically includes cerium, chemically modifies the high concentration hydrocarbon etch residue 6 so that it is soluble in an aqueous acidic solution. Typically, the aqueous acidic solutions is also provided by the aqueous lanthanoid solution, which dissolves following chemical modification the high concentration etch residue 6, or the chemically modified high concentration etch residue may be removed by an acid such as sulfuric acid ($H_2SO_4$). The aqueous lanthanoid solution 35 may be applied by being poured, brushed or sprayed onto the high concentration hydrocarbon etch residue 6. The term "aqueous lanthanoid solution" denotes an etch chemistry containing a salt or complex of a lanthanoid element. In some examples, the aqueous solution may further include at least one nitrogen including compound selected from the group consisting of ammonia ($NH_4$), nitrate ($NO_3$) and a combination thereof.

In some examples, the aqueous lanthanoid solution 35 may include a salt of cerium (Ce). For example, the salt of cerium may be cerium ammonium nitrate (CAN) with the chemical formula of $Ce(NH_4)_2(NO_3)_6$. Cerium is only one example of a lanthanide that may be suitable for use in the aqueous lanthanoid solution 35. In some embodiments, the salt or complex of the lanthanoid element is present in the aqueous lanthanoid solution in a concentration ranging from 100 g/L to 500 g/L. In different embodiments, the concentration of the salt or complex of the lanthanoid element that is present in the aqueous lanthanoid solution may be, for example, 150, 200, 250, 300, 350, 400, 450, 500, 550 and 600 g/L, or within a range established by any two of these values.

In some embodiments, the aqueous lanthanoid solution 35 may be applied to the etch reside 6 on the etched surface for a time period ranging from 15 minutes to 60 minutes at a temperature ranging from 50° C. to 80° C. In one example, the aqueous lanthanoid solution 35 is composed of a $Ce(NH_4)_2(NO_3)_6$ and is applied for 60 minutes, in which the aqueous lanthanoid solution 35 is applied to the etch surface at a temperature of 70° C.

The aqueous lanthanoid solution 35 removes the high concentration hydrocarbon etch residues 6, in which the aqueous lanthanoid solution 35 may include a graphalitic like component. For example, after etching with the $C_xH_yF_z$ and $O_2$ plasma etch chemistry, the etch residue 6 that is formed on the outer sidewall surfaces of the gate sidewall spacer 1 and the upper surface of the semiconductor substrate 5 between adjacent gate structures 10 may have a particle size diameter of 10 microns or greater. Applicants have determined that prior cleaning compositions, e.g., $NH_3$ or $N_2H_2$ dry stripping compositions, have been unable to reduce this particle size to be less than 10 microns.

A first application of the aqueous lanthanoid solution 35, e.g., $Ce(NH_4)_2(NO_3)_6$, to the high concentration hydrocarbon etch residue 6 may reduce the particle size diameter to 1 micron or less. In some embodiments, a first treatment being applied to the high concentration hydrocarbon etch residue 6 may reduce the particle size diameters of the residue to within a range of 100 nm to 1 micron. In different embodiments, the particle diameter size following a first application of the aqueous lanthanoid solution 35 may be, for example, 150, 200, 250, 300, 350, 400, 450, 500, 550, 600, 650, 700, 750, 800, 850, 900 and 950 nm, or within a range established by any two of these values.

In some embodiments, the high concentration hydrocarbon etch residue 6 may be removed using multiple applications of the aqueous lanthanoid solution 35. For example, a second application of the aqueous lanthanoid solution, e.g., $Ce(NH_4)_2(NO_3)_6$, to the high concentration hydrocarbon etch residue 6 may reduce the particle size diameter to 300 nm or less. In some embodiments, the particle diameter size following the second application of the aqueous lanthanoid solution may be, for example, 50, 60, 70, 80, 90, 100, 110, 120, 130, 140, 150, 160, 170, 180, 190, 200, 215, 230, 245, 260, 275, 290 and 295 nm, or within a range established by any two of these values. In one example, the aqueous lanthanoid solution 35 is composed of a $Ce(NH_4)_2(NO_3)_6$ and each of the first and second applications of the aqueous lanthanoid solution includes an application time period of 60 minutes at a temperature of 70° C. In some embodiments, an entirety of the high concentration hydrocarbon etch residue 6 is removed by the multiple applications of the aqueous lanthanoid solution.

In some embodiments, although the aqueous lanthanoid solution 35 removes the high concentration hydrocarbon residue 6, the application of the aqueous lanthanoid solution 35 to the etch residue 6 leaves a lanthanoid containing residue on the etched surfaces. For example, an aqueous lanthanoid solution of $Ce(NH_4)_2(NO_3)_6$ may produce a lanthanoid containing residue including cerium (Ce) on the etched surfaces. In some embodiments, the lanthanoid containing residue can be removed using sulfuric acid ($H_2SO_4$). The application of sulfuric acid ($H_2SO_4$) to remove the lanthanoid containing residue may be for a time period ranging from 15 minutes to 1 hour. The application of sulfuric acid ($H_2SO_4$) may be at a temperature ranging from 20° C. to 90° C. In one example, the application of sulfuric acid ($H_2SO_4$) may be applied for 30 minutes at a temperature of 70° C. to remove the lanthanoid containing residue, e.g., cerium containing residue.

Although, the methods disclosed herein can remove the high hydrocarbon etch residue 6 that results from etch processing with $C_xH_yF/O_2$ etch plasma etch chemistries with only the wet cleaning processes that employ aqueous lanthanoid solutions, such as $Ce(NH_4)_2(NO_3)_6$, the wet cleaning processes disclosed herein may be used in combination with dry cleaning processes, such as $O_2$ plasma strip or $NH_3$ strip compositions.

It is noted that the clean process including the aqueous lanthanoid solution 35, such as $Ce(NH_4)_2(NO_3)_6$, to remove high concentration hydrocarbon etch residues 6, in combination with a sulfuric acid ($H_2SO_4$) rinse to remove lanthanoid residues, does not etch the semiconductor material of the semiconductor substrate 5, e.g., silicon, or the dielectric material of the gate sidewall spacers 1, such as a nitride gate sidewall spacer 1, e.g., silicon nitride gate sidewall spacer 1. In one embodiment, an aqueous lanthanoid solution 35 of $Ce(NH_4)_2(NO_3)_6$ to remove high concentration hydrocarbon etch residues 6, that is applied to a semiconductor substrate 5 of silicon at a temperature on the order of 70° C. for a time period of 60 minutes, in combination with a sulfuric acid ($H_2SO_4$) rinse, will remove less than 3.0 nm of silicon in depth, as measured from an upper surface of a semiconductor substrate 5. In another embodiment, the aqueous lanthanoid solution 35 of $Ce(NH_4)_2(NO_3)_6$ to remove high concentration hydrocarbon etch residues, applied to a semiconductor substrate 5 of silicon at a temperature on the order of 70° C. for a time period of 60 minutes, in combination with a sulfuric acid ($H_2SO_4$) rinse, will remove less than 2.0 nm of silicon, e.g., will remove 1.7 nm of silicon or less.

In one embodiment, an aqueous lanthanoid solution 35 of $Ce(NH_4)_2(NO_3)_6$ to remove high concentration hydrocarbon etch residues 6, applied to a gate sidewall spacer 1 of nitride, e.g., silicon nitride, at a temperature on the order of 70° C. for a time period of 60 minutes, in combination with a sulfuric acid ($H_2SO_4$) rinse, will remove less than 3.0 nm of nitride, e.g., silicon nitride, from the outer surface of the gate sidewall spacer 1 in the width dimension. In another embodiment, the aqueous lanthanoid solution of $Ce(NH_4)_2(NO_3)_6$ to remove high concentration hydrocarbon etch residues, applied to a gate sidewall spacer 1 at a temperature on the order of 70° C. for a time period of 60 minutes, in combination with a sulfuric acid ($H_2SO_4$) rinse, will remove less than 2.0 nm of nitride, e.g., silicon nitride, from the outer surface of the gate sidewall spacer 1 in the width dimension.

FIG. 4 depicts one embodiment of forming source and drain regions 40 on the opposing sides of the gate structure 10 after a least a majority of the etch residue 6 has been removed. As used herein, the term "drain" means a doped region in a semiconductor substrate that is located at the end of the channel in field effect transistors (FET), in which carriers are flowing out of the transistor through the drain. As used herein, the term "source" is a doped region from which majority carriers are flowing into the channel. The source and drain regions 40 may be formed by ion implanting an n-type or p-type dopant into the semiconductor substrate 5. As used herein, "p-type" refers to the addition of impurities to an intrinsic semiconductor that creates deficiencies of valence electrons. In a type IV semiconductor, such as silicon (Si), examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as silicon (Si), examples of n-type dopants, i.e., impurities, include but are not limited to antimony, arsenic and phosphorous. Typically, the conductivity type, i.e., n-type or p-type conductivity, for the source and drain regions 40 is the conductivity type of the semiconductor device, e.g., n-type field effect transistor (nFET) or p-type field effect transistor (pFET).

In another embodiment, the present disclosure provides a cleaning chemistry for removing hydrocarbon etch residues. In some examples, the cleaning chemistry may include an aqueous solution including a complex including a lanthanoid selected from the group consisting of lanthanum, cerium, praseodymium, promethium, samarium, europium, gadolinium, terbium, dysprosium, holmium, erbium, thulium, ytterbium, lutetium and combinations thereof. In some embodiments, the aqueous solution may further include at least one nitrogen including compound selected from the group consisting of ammonia ($NH_4$), nitrate ($NO_3$) and a combination thereof. In one example, the aqueous cleaning composition may be cerium ammonium nitrate ($Ce(NH_4)_2(NO_3)_6$), (CAN).

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The following examples are provided to further illustrate the present disclosure and demonstrate some advantages that arise therefrom. It is not intended that the disclosure be limited to the specific examples disclosed.

Examples

Figure 6:
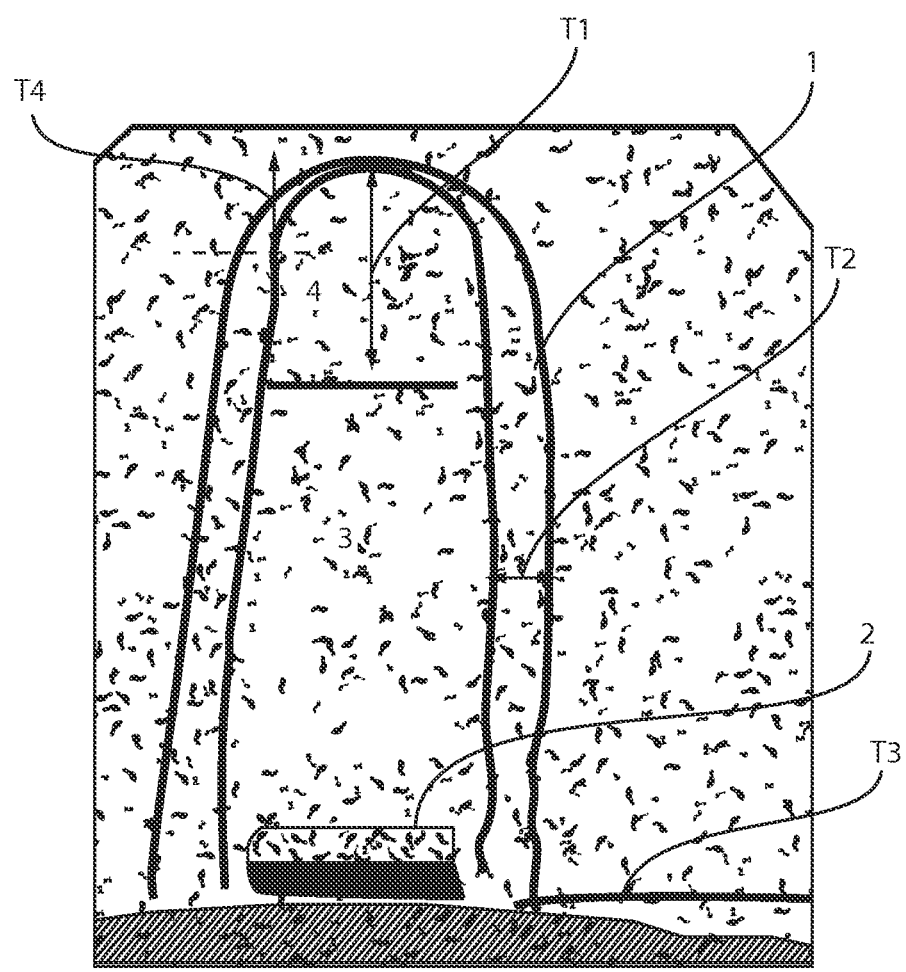
FIG. 6 is a side cross-sectional view depicting a test gate structure, in accordance with the present disclosure.

Test gate structures 10 were formed on a silicon semiconductor substrate 5. An example of the test gate structures 10 are depicted in FIG. 6. The test gate structures 10 including a polysilicon gate conductor 3 on a silicon oxide gate dielectric 2. A nitride gate dielectric cap 4 was present on the upper surface of each gate test gate structure 10. A gate sidewall spacer 1 of silicon nitride was formed on the sidewalls of the gate stack. The gate sidewall spacer 1 was formed using a process sequence employing a $C_4H_9F$ plasma that forms a high concentration hydrocarbon etch residue on the sidewalls of the gate sidewall spacer 1 and the upper surface of the semiconductor substrate 5 that is adjacent to the gate structure.

The test gate structures were then treated with cleaning processes to remove the etch residue. In one test, a cleaning processes was applied to the high concentration etch residue that included a dry strip of $O_2$ followed by a wet cleaning composition of dilute HF. The data collected from this test is referred to as "O2 Strip+DHF" in Table 1. In another test, a cleaning processes was applied to the high concentration etch residue that included a dry strip of $NH_3$ followed by a wet cleaning composition of mixture of hydrogen peroxide, ammonium hydroxide and DI water. The data collected from this test is referred to as "NH3 Strip+H2O2/NH4OH/DI" in Table 1. In another test, a cleaning processes was applied to the high concentration etch residue that included a dry strip of $NH_3$ followed by a wet cleaning composition of buffered oxide etch (BOE). The data collected from this test is referred to as "NH3 Strip+BOE" in Table 1. In another test, a cleaning processes was applied to the high concentration etch residue that included a wet chemical clean with cerium ammonium nitrate $(Ce(NH_4)_2(NO_3)_6)$,(CAN) followed by hydrogen peroxide, ammonium hydroxide and DI water. The data collected from this test is referred to as "Lanthanoid+H2O2/NH4OH/DI" in Table 1. In another test, a cleaning processes was applied to the high concentration etch residue that included a wet chemical clean with cerium ammonium nitrate $(Ce(NH_4)_2(NO_3)_6)$,(CAN) followed by EKC265™ post-etch residue remover that is manufactured by DuPont™. The data collected from this test is referred to as "Lanthanoid+EKC265" in Table 1. In another test, a cleaning processes was applied to the high concentration etch residue that included a dry strip of $O_2$ plasma followed by hydrogen peroxide, ammonium hydroxide and DI water. The data collected from this test is referred to as "O2 Strip+H2O2/NH4OH/DI" in Table 1. In another test, a cleaning processes was applied to the high concentration etch residue that included a dry strip of $O_2$ plasma followed by buffered oxide etch (BOE). The data collected from this test is referred to as "O2 Strip+BOE" in Table 1. In another test, a cleaning processes was applied to the high concentration etch residue that included a wet chemical clean with cerium ammonium nitrate $(Ce(NH_4)_2(NO_3)_6)$(CAN) followed by sulfuric acid $(H_2SO_4)$. The data collected from this test is referred to as "Lanthanoid+H2SO4" in Table 1. In another test, a cleaning processes was applied to the high concentration etch residue that included a wet chemical clean with cerium ammonium nitrate $(Ce(NH_4)_2(NO_3)_6)$(CAN) followed by sulfuric acid $(H_2SO_4)$ followed by EKC265™ post-etch residue remover that is manufactured by DuPont™. The data collected from this test is referred to as "Lanthanoid+H2SO4+EKC265" in Table 1.

Referring to FIG. 6, following the above tests, measurements were conducted for the thickness T1 of the SiN hardmask 4 that is present atop the gate conductor 3 of the test gate structure 10; the thickness T2, i.e., width, of the silicon nitride (SiN) gate sidewall spacer 1; the amount of silicon (Si) loss T3 at the semiconductor substrate surface 5; and the silicon nitride (SiN) pull-down T4. Each of the data points recorded in Table 1 for the above measurements is in nanometers (nm)

TABLE 1

| CLEAN PROCESS | SiN HM Thickness (nm) | SiN Spacer Thickness (nm) | Si Loss (nm) | SiN Pull-down (nm) |
|---|---|---|---|---|
| O2 Strip + DHF | 25.4 | 6.1 | 3 | 3.3 |
| NH3 strip + H2O2/NH4OH/DI | 24.6 | 6.1 | 1.5 | 4 |
| NH3 strip + BOE | 24.1 | 3.2 | 1.4 | 8.7 |
| Lanthanoid + H2O2/NH4OH/DI | 24.3 | 4.3 | 1 | 3.4 |
| Lanthanoid + EKC265 | 24.4 | 5.9 | 1 | 3.5 |
| O2 Strip + H2O2/NH4OH/DI | 23.8 | 5.4 | 1.4 | 4.6 |
| O2 Strip + BOE | 24.9 | 5.4 | 1.2 | 3.8 |
| Lanthanoid + H2SO4 | 24.4 | 5.1 | 1.7 | 4 |
| Lanthanoid + H2SO4 + EKC265 | 23 | 2.6 | 3.4 | 7.2 |

Referring to the data in Table 1, the wet chemical clean with cerium ammonium nitrate $(Ce(NH_4)_2(NO_3)_6)$(CAN) followed by sulfuric acid $(H_2SO_4)$ resulted in minimized silicon loss at the semiconductor substrate 5. Specifically, the loss of silicon at the semiconductor substrate 5 that was treated with the wet chemical clean of cerium ammonium nitrate $(Ce(NH_4)_2(NO_3)_6)$(CAN) followed by sulfuric acid $(H_2SO_4)$ was limited to 1.7 nm.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for cleaning etch residues comprising:
    treating an etched surface with an aqueous lanthanoid solution, wherein the aqueous lanthanoid solution removes an etch residue comprising a majority of hydrocarbons and at least carbon, oxygen, fluorine, nitrogen and silicon, wherein carbon component of the etch residue is graphitic.

2. The method of claim 1, wherein the aqueous lanthanoid solution comprises a salt or complex of a member of the lanthanide family.

3. The method of claim 1, wherein the salt or complex of the lanthanoid element is present in the aqueous lanthanoid solution in a concentration ranging from 100 g/L to 500 g/L.

4. The method of claim 1, wherein the aqueous lanthanoid solution includes cerium ammonium nitrate $(Ce(NH_4)_2(NO_3)_6)$,(CAN).

5. The method of claim 1, wherein the etch residue comprises hydrocarbon is an amount greater than 50%.

6. The method of claim 1, wherein the etch residue is present on a semiconductor substrate, a gate sidewall spacer or a combination thereof.

7. The method of claim 1 further comprising removing residues from the aqueous lanthanoid solution using sulfuric acid $(H_2SO_4)$.

8. A method of forming a semiconductor device comprising
    forming a gate structure on a channel region of a semiconductor substrate, the gate structure formed using an etch process the forms an etch residue on at least a sidewall of a gate spacer to the gate structure and an upper surface of the semiconductor substrate adjacent to the gate structure, wherein a majority of the etch residue composition is comprised of hydrocarbons, wherein a carbon portion of the etch residue is graphitic; and
    removing the etch residue with an aqueous lanthanoid solution.

9. The method of claim 8, wherein the forming of the gate structure comprises:
    depositing at least one gate dielectric layer on the semiconductor substrate and at least one gate conductor layer on the gate dielectric layer to provide a gate stack;
    patterning the gate stack to provide a remaining portion of a gate stack on the channel region of the semiconductor substrate;
    forming a conformal dielectric layer on the remaining portion of the gate stack; and
    etching the conformal dielectric layer to provide the gate sidewall spacer.

10. The method of claim 8, wherein the etching the conformal dielectric layer comprises a plasma etch comprising a $C_4H_9F$ etch chemistry, wherein the $C_4H_9F$ etch chemistry forms an etch residue comprising hydrocarbon is an amount greater than 50%.

11. The method of claim 10, wherein the etch residue further comprises at least one element selected from the group consisting of carbon, oxygen, fluorine, nitrogen and silicon.

12. The method of claim 8, wherein the aqueous lanthanoid solution comprises a salt or complex of a member of the lanthanide family.

13. The method of claim 8, wherein the salt or complex of the lanthanoid element is present in the aqueous lanthanoid solution in a concentration ranging from 100 g/L to 500 g/L.

14. The method of claim 8, wherein the aqueous lanthanoid solution includes cerium ammonium nitrate $(Ce(NH_4)_2(NO_3)_6)$,(CAN).

15. The method of claim 8 further comprising removing residues from the aqueous lanthanoid solution using sulfuric acid $(H_2SO_4)$.

* * * * *